(12) United States Patent
Horng et al.

(10) Patent No.: US 8,581,289 B2
(45) Date of Patent: *Nov. 12, 2013

(54) SEMICONDUCTOR LIGHT EMITTING COMPONENT

(71) Applicants: NCKU Research and Development Foundation, Tainan (TW); Phostek, Inc., Hsinchu (TW)

(72) Inventors: Ray-Hua Horng, Taichung (TW); Yi-An Lu, Chiayi (TW)

(73) Assignees: NCKU Research and Development Foundation, Tainan (TW); Phostek, Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/830,396

(22) Filed: Mar. 14, 2013

(65) Prior Publication Data

US 2013/0200419 A1 Aug. 8, 2013

Related U.S. Application Data

(63) Continuation of application No. 13/102,350, filed on May 6, 2011, now Pat. No. 8,476,663.

(51) Int. Cl.
*H01L 33/00* (2010.01)

(52) U.S. Cl.
USPC ................................. 257/98; 257/E33.072

(58) Field of Classification Search
USPC .................................................. 257/E33.072
See application file for complete search history.

(56) References Cited

U.S. PATENT DOCUMENTS

| | | | |
|---|---|---|---|
| 6,486,499 B1 | 11/2002 | Krames et al. | |
| 6,514,782 B1 | 2/2003 | Wierer, Jr. et al. | |
| 6,678,307 B2 | 1/2004 | Ezaki et al. | |
| 6,885,035 B2 | 4/2005 | Bhat et al. | |
| 8,476,663 B2 * | 7/2013 | Horng et al. | 257/98 |
| 2002/0068373 A1 | 6/2002 | Lo et al. | |
| 2005/0226299 A1 | 10/2005 | Horng et al. | |
| 2011/0169036 A1 | 7/2011 | Ibbetson et al. | |
| 2012/0049218 A1 * | 3/2012 | Horng et al. | 257/98 |
| 2012/0286311 A1 | 11/2012 | Margalit | |

* cited by examiner

*Primary Examiner* — Lex Malsawma
(74) *Attorney, Agent, or Firm* — Huffman Law Group, P.C.

(57) ABSTRACT

A semiconductor light emitting component including an epitaxial structure, a first electrode, a second electrode, a first cutout structure and a second cutout structure is provided. The epitaxial structure includes a first type doped layer, a light emitting portion and a second type doped layer. The first electrode is formed on a surface of the first type doped layer. The second electrode is formed on a surface of the second type doped layer. The first cutout structure is formed in the first type doped layer to expose at least a portion of the first electrode. The second cutout structure is formed in the first type doped layer, the light emitting portion and the second type doped layer so as to expose at least a portion of the second electrode.

15 Claims, 10 Drawing Sheets

SEMICONDUCTOR LIGHT EMITTING COMPONENT

CROSS-REFERENCE TO RELATED APPLICATION

This application is a Continuation of application Ser. No. 13/102,350, filed 6 May 2011.

FIELD OF THE INVENTION

The present invention relates to a light emitting element, and more particularly to a semiconductor light emitting component.

BACKGROUND OF THE INVENTION

Figure 1A:
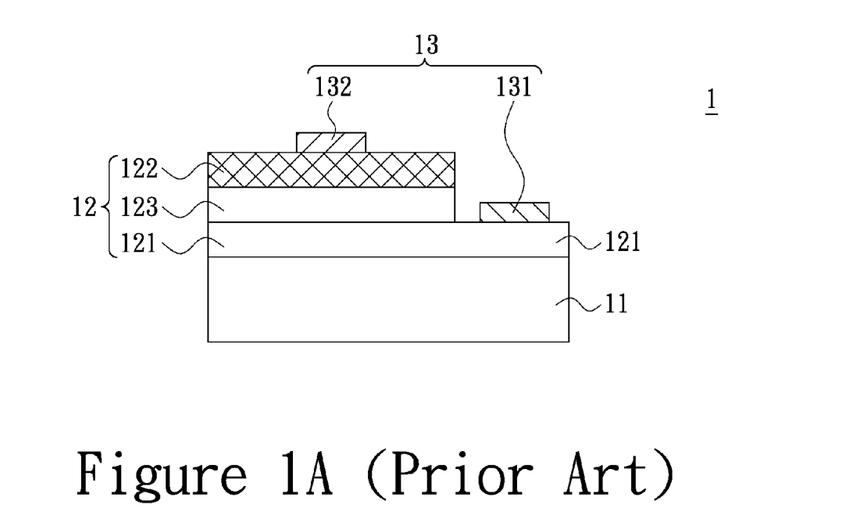
FIG. 1A illustrates a schematic view of a conventional horizontal light emitting diode.

FIG. 1A illustrates a schematic view of a conventional horizontal light emitting diode. Referring to FIG. 1A, the horizontal light emitting diode 1 includes an epitaxial substrate 11, an epitaxial structure 12 grown from the epitaxial substrate 11 by an epitaxy growth process, and an electrode unit 13 disposed on the epitaxial structure 12 for providing electrical energy. The epitaxial substrate 11 is made of a material such as sapphire or SiC so that an epitaxial growth of a gallium-nitride-based (GaN-based) semiconductor material can be achieved on the epitaxial substrate 11.

The epitaxial structure 12 is usually made of the GaN-based semiconductor material. During the epitaxy growth process, the GaN-based semiconductor material epitaxially grows up from the epitaxial substrate 11 to form an n-type doped layer 121 and a p-type doped layer 122. When the electrical energy is applied to the epitaxial structure 12, a light emitting portion 123 at a junction of the n-type doped layer 121 and the p-type doped layer 122 will generate an electron-hole capture phenomenon. As a result, the electrons of the light emitting portion 123 will fall to a lower energy level and release energy with a photon mode. In one embodiment, the light emitting portion 123 is a multiple quantum well (MQW) structure capable of restricting a spatial movement of the electrons and the holes. Thus, a collision probability of the electrons and the holes is increased so that the electron-hole capture phenomenon occurs easily, thereby enhancing lighting emitting efficiency.

The electrode unit 13 includes a first electrode 131 and a second electrode 132. The first electrode 131 and the second electrode 132 are respectively in an ohmic contact with the n-type doped layer 121 and the p-type doped layer 122 and configured to provide electrical energy to the epitaxial structure 12. When a voltage is applied between the first electrode 131 and the second electrode 132, an electric current flow from the second electrode 132 to the first electrode 131 thru the epitaxial substrate 11 and is horizontally distributed in the epitaxial structure 12. Thus, a number of photons are generated by a photoelectric effect in the epitaxial structure 12. The horizontal light emitting diode 1 emits light from the epitaxial structure 12 due to the horizontally distributed electric current.

A manufacturing process of the horizontal light emitting diode is simple. However, the substrate of the horizontal light emitting diode is mostly a non-conductive sapphire substrate, with a positive electrode and a negative electrode of the horizontal light emitting diode 1 located on the same side (i.e., a co-planar electrodes configuration). In the horizontal light emitting diode 1 with the co-planar electrodes configuration, the electric current is non-uniform, which can cause a current crowding problem, a non-uniformity light emitting problem and a thermal accumulation problem, etc. As a result, the light emitting efficiency of the horizontal light emitting diode can be decreased, and even the horizontal light emitting diode can become damaged.

Generally, the current crowding problem can be reduced by improving the configuration of the electrodes or by changing the geometric shapes of the electrodes. For example, by extending the lengths of a P electrode and an N electrode, the current path from the P electrode to the N electrode is increased to avoid over crowding in the current path.

Figure 1B:
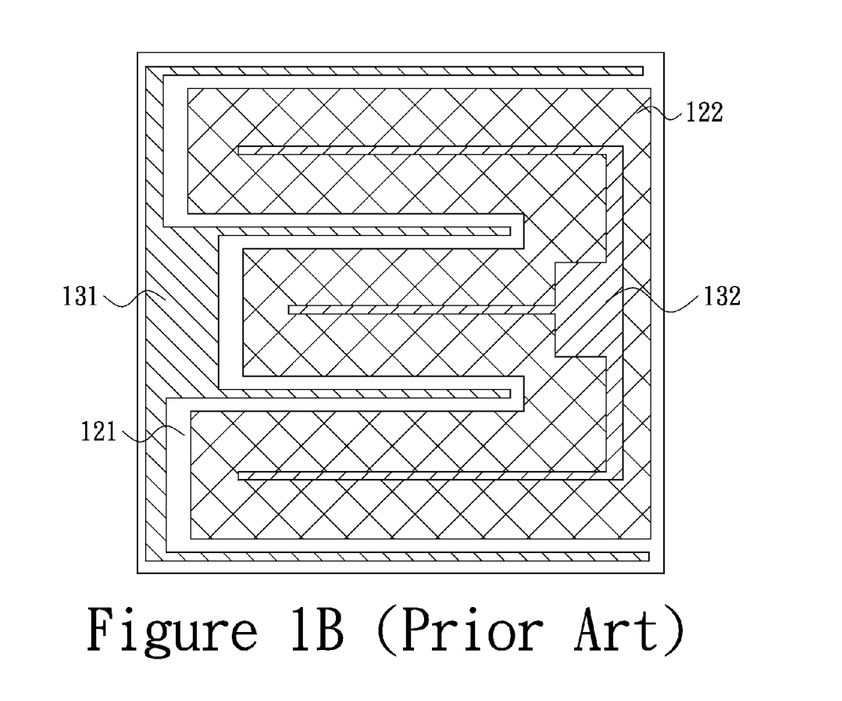
FIG. 1B illustrates a schematic view of a conventional finger-shaped electrodes configuration of a conventional horizontal light emitting diode.

Referring to FIG. 1B, a conventional finger-shaped electrodes configuration is shown. The finger-shaped electrodes configuration improves the uniformity of the electric current by extending the lengths of the electrodes over the surface of the configuration. It should be appreciated that the more interdigitated structures the finger-shaped electrodes configuration has, the more uniformly the electric current distributes. However, too much interdigitated structures will cause a reduction of a light output area because of a shading effect. To overcome such shading effect, vertical light emitting diodes have been developed.

Figure 2:
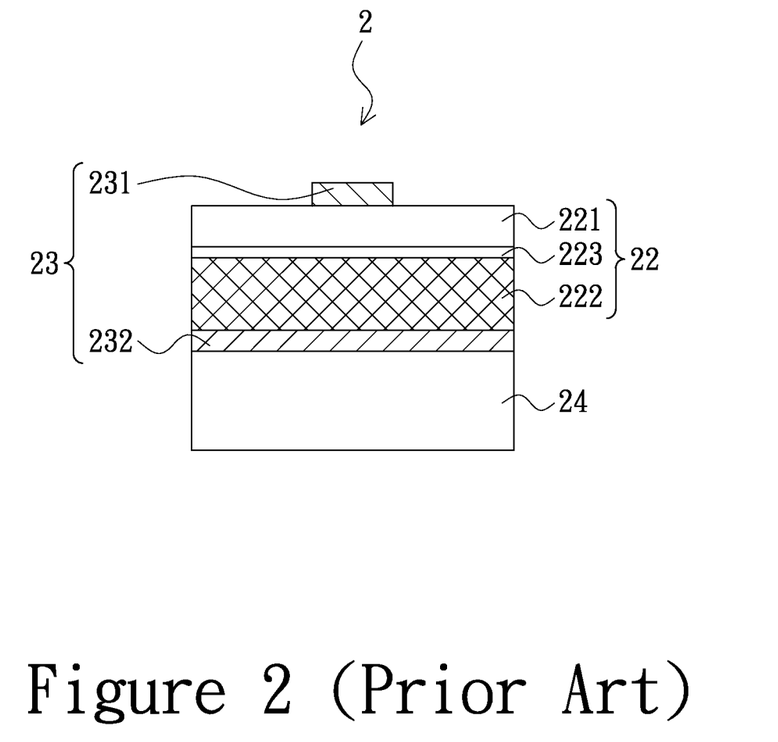
FIG. 2 illustrates a schematic view of a conventional vertical light emitting diode.

FIG. 2 illustrates a schematic view of a conventional vertical light emitting diode 2. The conventional vertical light emitting diode 2 includes an epitaxial structure 22 and an electrode unit 23 disposed on the epitaxial structure 22 for providing electrical energy. Similar to the diode of FIG. 1, the epitaxial structure 22 can be made of a GaN-based semiconductor material by an epitaxy growth process. During the epitaxy growth process, the GaN-based semiconductor material epitaxially grows up from an epitaxial substrate (not shown) to form an n-type doped layer 221, an MQW structure 223 and a p-type doped layer 222. Then, the electrode unit 23 is bonded to the epitaxial structure 22 after stripping the epitaxial substrate. The electrode unit 23 includes a first electrode 231 and a second electrode 232. The first electrode 231 and the second electrode 232 are respectively in ohmic contact with the n-type doped layer 221 and the p-type doped layer 222. In addition, the second electrode 232 can adhere to a heat dissipating substrate 24 so as to increase the heat dissipation efficiency. When a voltage is applied between the first electrode 231 and the second electrode 232, an electric current vertically flows. Thus, the conventional vertical light emitting diode 2 can effectively improve the current crowding problem, the non-uniformity light emitting problem and the thermal accumulation problem of the conventional horizontal light emitting diode 1. However, the shading effect of the electrodes still exists in the conventional vertical light emitting diode 2, which causes a reduction of the light emitting area. Furthermore, a manufacturing process of the conventional vertical light emitting diode 2 is complicated. For example, the epitaxial structure 22 is prone to be damaged by high heat when adhering the second electrode 232 to the heat dissipating substrate 24.

In view of the problems discussed above with reference to FIG. 1 and FIG. 2, what is needed is a semiconductor light emitting component applied to a light emitting diode so as to overcome the above disadvantages of the conventional horizontal light emitting diode and the conventional vertical light emitting diode.

SUMMARY OF THE INVENTION

The present invention provides a semiconductor light emitting component including an epitaxial structure, a first electrode, a second electrode, a first cutout structure and a second cutout structure. The epitaxial structure includes a first type doped layer, a light emitting portion and a second type doped layer. The first electrode is formed on a surface of the first type doped layer. The second electrode is formed on a surface of the second type doped layer. The first cutout structure is formed in the first type doped layer to expose at least a portion of the first electrode. The second cutout structure is formed in the first type doped layer, the light emitting portion and the second type doped layer so as to expose at least a portion of the second electrode.

In one embodiment of the present invention, the semiconductor light emitting component further includes a functional structure formed on the first electrode.

In one embodiment of the present invention, the first type doped layer is an n-type layer and the second type doped layer is a p-type layer.

In one embodiment of the present invention, the first type doped layer is a p-type layer and the second type doped layer is an n-type layer.

In one embodiment of the present invention, the functional structure includes an insulating layer formed on the first electrode, a reflective layer formed on the insulating layer, a seed layer formed on the reflective layer, and a permanent layer formed on the seed layer.

In one embodiment of the present invention, the functional structure includes an insulating layer formed on the first electrode, a reflective layer formed on the insulating layer, and a permanent layer formed on the reflective layer.

In one embodiment of the present invention, the functional structure includes an insulating reflective layer formed on the first electrode and a permanent layer formed on the insulating reflective layer.

The present invention also provides a semiconductor light emitting component including an epitaxial structure, a second electrode and a second cutout structure. The epitaxial structure includes a first type doped layer, a light emitting portion and a second type doped layer. The second electrode is formed on a surface of the second type doped layer. The second cutout structure formed in the first type doped layer, the light emitting portion and the second type doped layer so as to expose at least a portion of the second electrode.

In one embodiment of the present invention, the semiconductor light emitting component further includes a first electrode formed on a surface of the first type doped layer.

In one embodiment of the present invention, the semiconductor light emitting component further includes a functional structure formed on the first electrode.

In one embodiment of the present invention, the functional structure includes an insulating layer formed on the first electrode, a reflective layer formed on the insulating layer, a seed layer formed on the reflective layer, and a permanent layer formed on the seed layer.

In one embodiment of the present invention, the functional structure includes an insulating layer formed on the first electrode, a reflective layer formed on the insulating layer, and a permanent layer formed on the reflective layer.

In one embodiment of the present invention, the functional structure includes an insulating reflective layer formed on the first electrode and a permanent layer formed on the insulating reflective layer.

In one embodiment of the present invention, the first type doped layer is an n-type layer and the second type doped layer is a p-type layer.

In one embodiment of the present invention, the first type doped layer is a p-type layer and the second type doped layer is an n-type layer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to FIG. 3 to FIG. 6. It should be appreciated that the following descriptions of embodiments of this invention are presented herein for purpose of illustration and description only. It is not intended to be exhaustive nor limited to the precise forms disclosed.

FIG. 3A to FIG. 3E illustrate a process flow of a method for manufacturing a semiconductor light emitting component 3 in accordance with an embodiment of the present invention. Referring to FIG. 3A to FIG. 3E, at first, a substrate 30 is provided and an epitaxial structure 301 is formed on the substrate 30, wherein a first surface 312 of the epitaxial structure 301 contacts the substrate 30. The epitaxial structure 301 includes a first type doped layer 31, a light emitting portion 33 and a second type doped layer 32. A first electrode 34 is formed on a second surface 311 of the first type doped layer 31, and a second electrode 35 is formed on a third surface 321 of the second type doped layer 32. In one example, the first type doped layer 31 has the first surface 312 to contact the substrate 30, and the first surface 312 is opposite to the second surface 311.

Figure 3A:
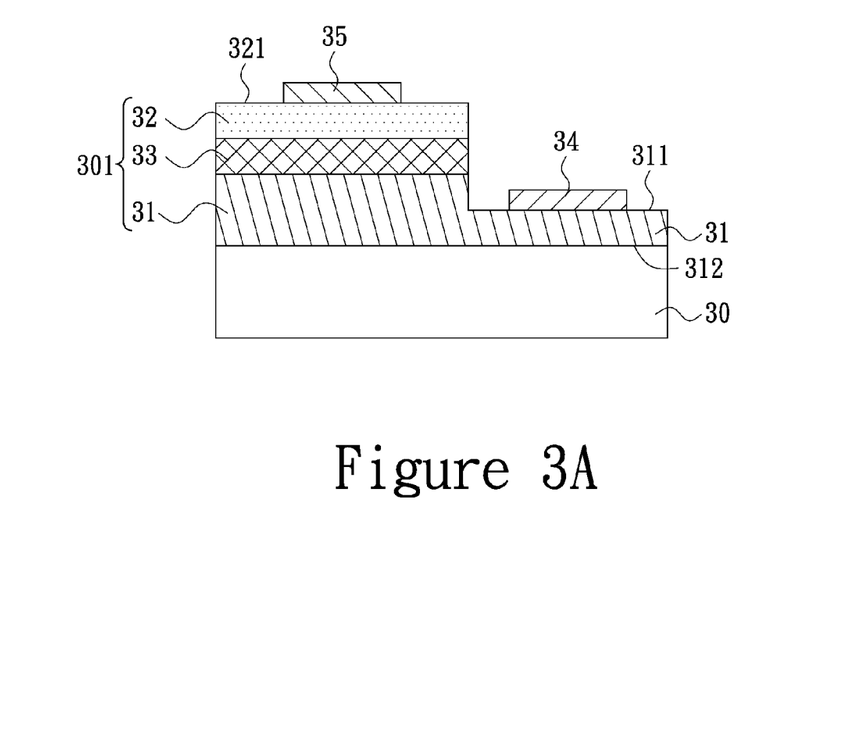
FIG. 3A to FIG. 3G illustrate a process flow of a method for manufacturing a semiconductor light emitting component in accordance with an embodiment of the present invention.
Figure 3B:
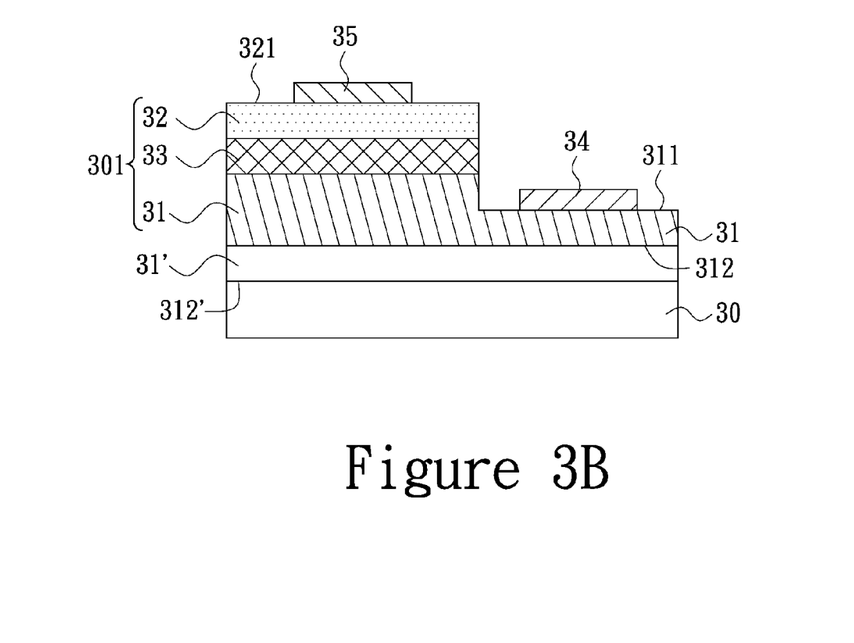

Referring to FIG. 3B, it is noted that the epitaxial structure 301 may further comprises a contacting layer 31', disposed between the first type doped layer 31 and the substrate 30, comprises one or any combination selected from the group consisting of undoped layer, buffer layer, and super lattice layer. In another example, the contacting layer 31' has the first surface 312' to contact the substrate 30.

In the present embodiment, the substrate 30 can be, for example, a sapphire epitaxial substrate or a SiC epitaxial substrate. The epitaxial structure 301 is capable of achieving a basic structure of a light emitting diode. The first type doped layer 31 can be an n-type layer, the second type doped layer 32 can be a p-type layer, and the light emitting portion 33 is located at a junction of the first type doped layer 31 and the second type doped layer 32. The light emitting portion 33 can be, for example, an MQW structure. It is noted that, the first type doped layer 31 can also be a p-type layer, and the second type doped layer 32 is thus correspondingly an n-type layer.

Figure 3C:
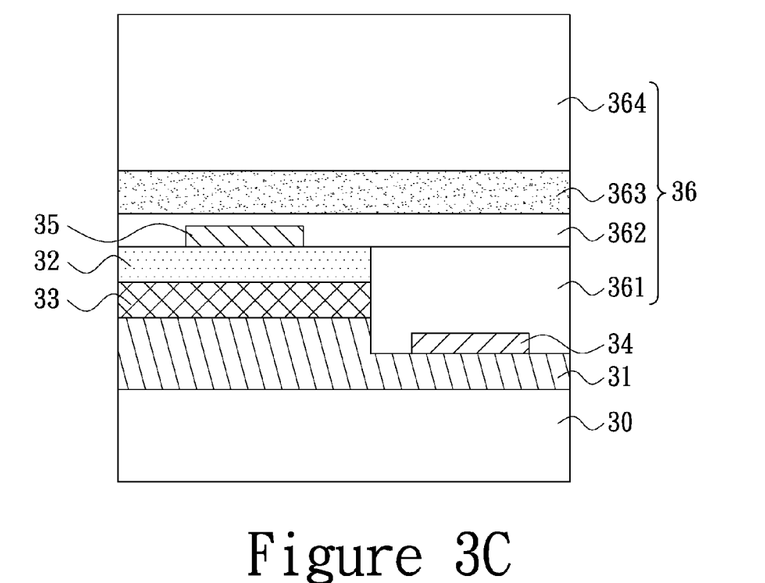

Referring to FIGS. 3A and 3C, a functional structure 36 is formed on the first type doped layer 31, the second type doped layer 32, the first electrode 34 and the second electrode 35 using an in-situ method. The functional structure 36 includes an insulating layer 361, a reflective layer 362, a seed layer 363 and a permanent substrate 364. First, the insulating layer 361 is formed on the first type doped layer 31 and the first electrode 34. Then, the reflective layer 362 is formed on the insulating layer 361, the second type doped layer 32, and the second electrode 35. Then, the seed layer 363 is formed on a surface of the reflective layer 362. Then, the permanent substrate 364 is formed on a surface of the seed layer 363. The insulating layer 361 can be, for example, a silicon oxide layer. The reflective layer 362 can be, for example, a titanium/ aluminum (Ti/Al) metal layer or a titanium/silver (Ti/Ag) metal layer. The seed layer 363 can be, for example, a gold (Au) layer. In one embodiment, the thickness of the seed layer 363 is approximately 150 nm. When the reflective layer 362 is electrically conductive, the seed layer 363 can be formed by an electroplating or an electroless plating process. The permanent substrate 364 can be made of copper by an electroplating process. A thickness of the permanent substrate 364 is in a range from 50 um to 100 um. Additional, the permanent substrate 364 can be made of silicon oxide using an in-situ chemical vapor deposition process.

Figure 3D:
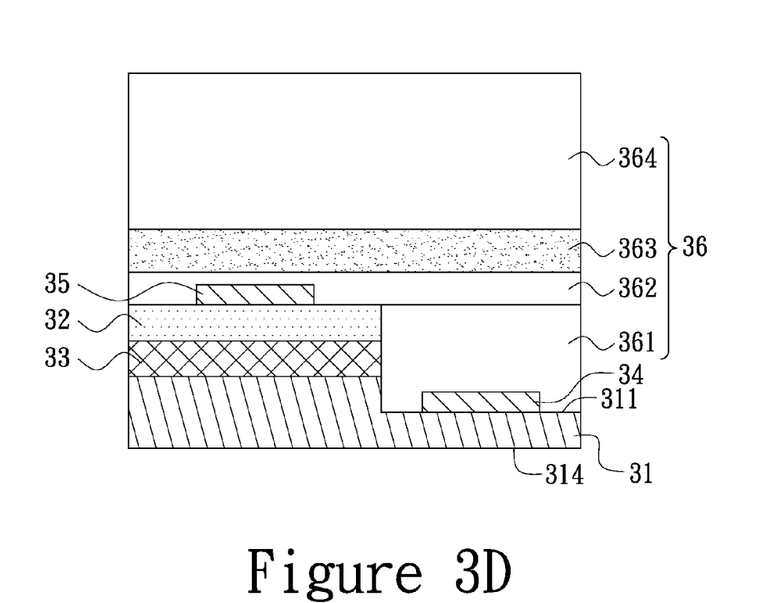

Referring to FIG. 3D, the substrate 30 is removed from the epitaxial structure by a laser lift-off (LLO) method or a chemical etching lift-off (CLO) method. Additionally, the substrate removing step may also roughen the first surface 312, originally contacting the substrate, to form a first roughened surface 314, before the following etching step.

Figure 3E:
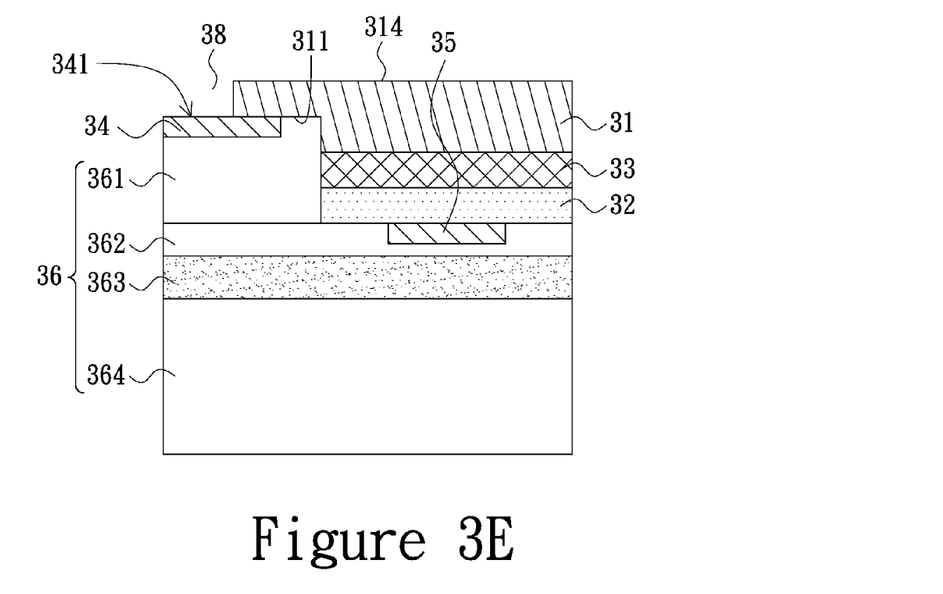

Referring to FIG. 3E, after the substrate 30 is removed, the entire remaining structure is then turned over 180 degrees. A first cutout structure 38 is formed by etching to remove a portion of a first roughened surface 314 of the first type doped layer 31, thereby exposing at least a portion of a surface 341 of the first electrode 34. Subsequently, referring to FIG. 3F, the first roughened surface 314 of the first type doped layer 31 is further roughened to form a second roughened surface 316, so as to increase light emitting efficiency. It is noted that the steps according to FIGS. 3E and 3F may exchange.

When the reflective layer 362, the seed layer 363 and the permanent substrate 364 all are electrically conductive, the semiconductor light emitting component 3 as shown in FIG. 3E is a vertical light emitting diode.

It is noted that the first cutout structure 38 in the present embodiment is used for exposing at least a portion of the surface 341 of the first electrode 34. In actual practice, an area of the portion of the surface 341 can be much less than an area of the first electrode 34. As above-mentioned, a light emitting diode has a length extension of the P electrode and a length extension of the N electrode to reduce the current crowding problem. However, a large area electrode will cause a shading effect. In the present embodiment of the present invention, the epitaxial structure is etched in a small area after being turned over, thereby forming the first cutout structure 38 with a small area and exposing a portion of the surface 341 of the first electrode 34, and further achieving a subsequent electrical connection with the voltage. Therefore, the method of the present embodiment can manufacture a light emitting diode with an ultra-low shade effect.

Figure 3F:
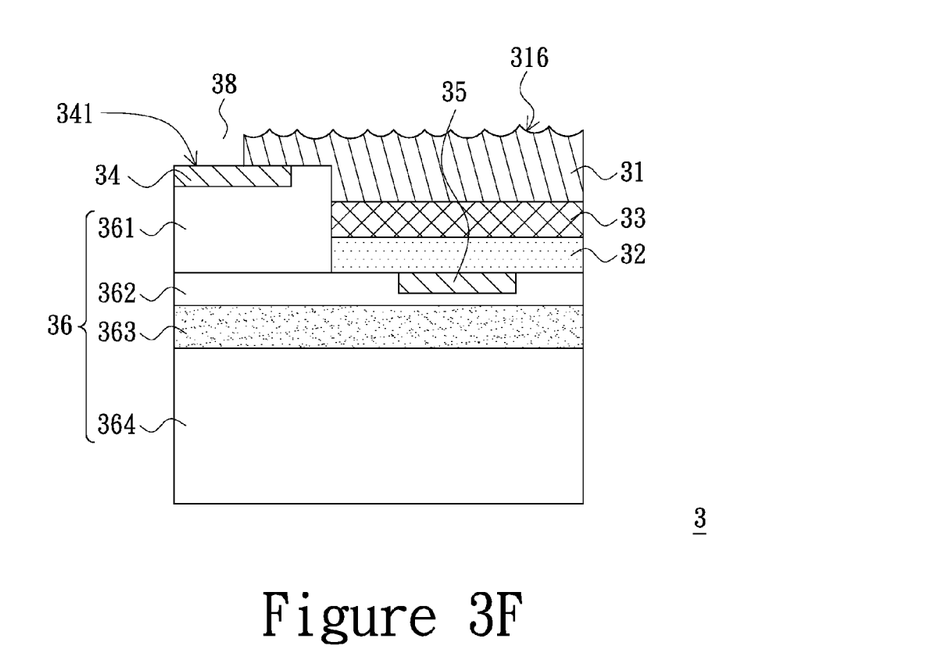

Referring to FIG. 3F, the portion of the surface 341 of the first electrode 34 can be etched by using a dry etching method. The first roughened surface 314 can be further roughened to form the second roughened surface 316 by using a phosphate solution at a temperature of approximately 130 celsius degrees or a sodium hydroxide solution at a temperature of approximately 80 celsius degrees.

Figure 3G:
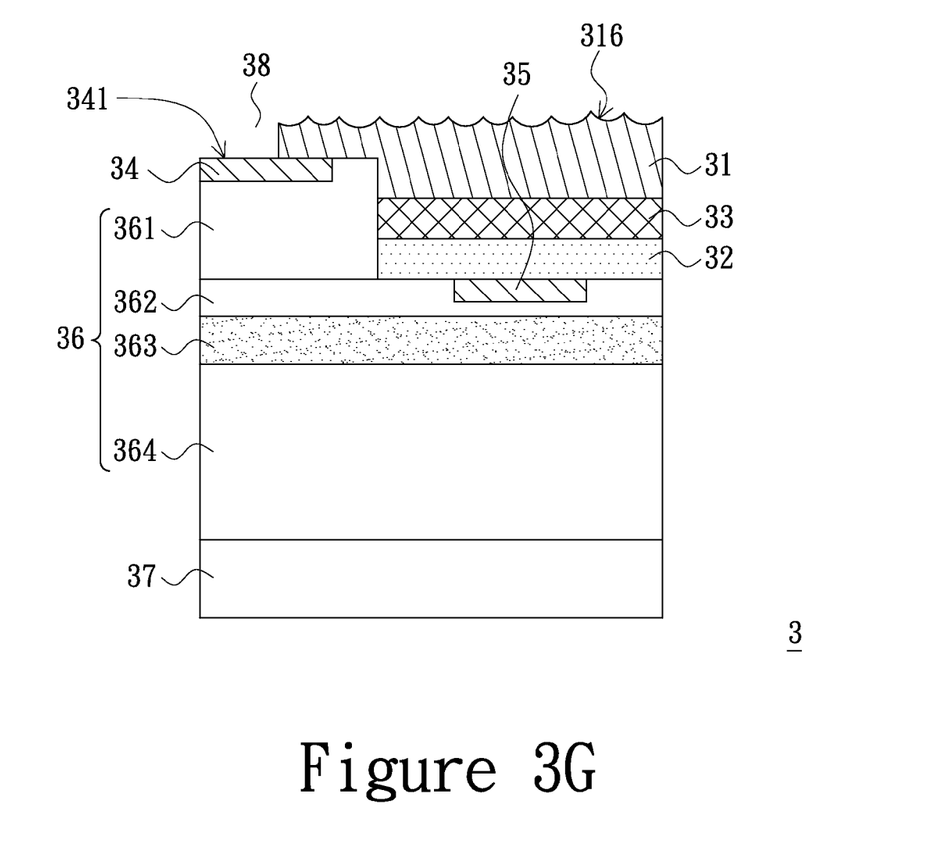

Still referring to FIG. 3G, the permanent substrate 364 can be directly contacted with a heat sink 37 so as to dissipate heat quickly.

As described above, the functional structure 36, including the insulating layer 361, the reflective layer 362, the seed layer 363 and the permanent substrate 364, can be formed directly using an in-situ method, such as physical vapor deposition, chemical vapor deposition, electroplating or electroless plating. In other words, the functional structure 36 can be formed without an additional adhering and assembling process. Thus, the method in the present embodiment is simpler than conventional method. Additionally, the functional structure 36 can be adjusted according to the requirement. For example, the functional structure 36 can only contain the insulating layer 361, the reflective layer 362 and the permanent substrate 364 or only contain the insulating layer 361 and the permanent substrate 364. Since the reflective layer 362 is mainly used as a mirror to increase the light emitting efficiency, the mirror can be achieved by a titanium/aluminum layer or a titanium/silver layer. For example, a thickness of the titanium layer is about 10 nm and a thickness of the silver layer is about 300 nm. The titanium layer is configured for increasing adhesion. It is noted that it is not necessary for the mirror to be electrically conductive. The mirror can also be an insulating reflective layer using a distributed Bragg reflector (DBR) in other embodiments. Thus, a horizontal light emitting diode can be formed by coupling with other structural designs.

Figure 4A:
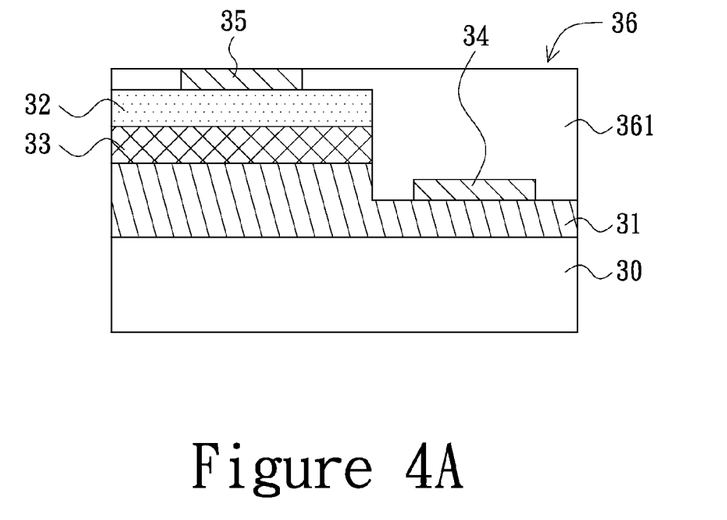
FIG. 4A illustrates a schematic view of an insulating layer of a functional structure in accordance with an embodiment of the present invention.
Figure 4B:
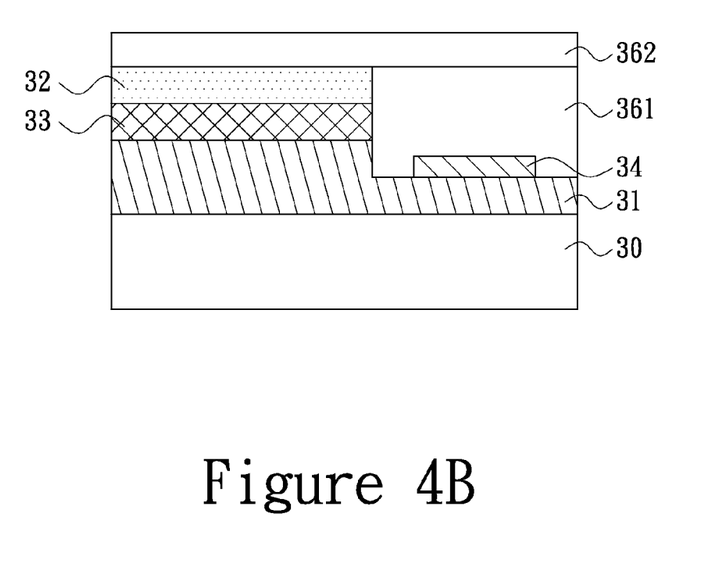
FIG. 4B illustrates a schematic view of a semiconductor light emitting component in accordance with an embodiment of the present invention.

FIG. 4A illustrates a schematic view of an insulating layer of a functional structure 36 in accordance with another embodiment of the present invention. Referring to FIG. 4A, an insulating layer 361 of the functional structure 36 is further formed on the second type doped layer 32 while the second electrode 35 is exposed from the insulating layer 361. Additionally, FIG. 4B illustrates a schematic view of a functional structure. Referring to the FIG. 4B, when a reflective layer 362 is a conductor coupled with the second type doped layer 32, the second electrode 35 described in the foregoing embodiments can thus be omitted and the reflective layer 362 in ohmic contact with the second type doped layer 32 works as an electrode.

Figure 5A:
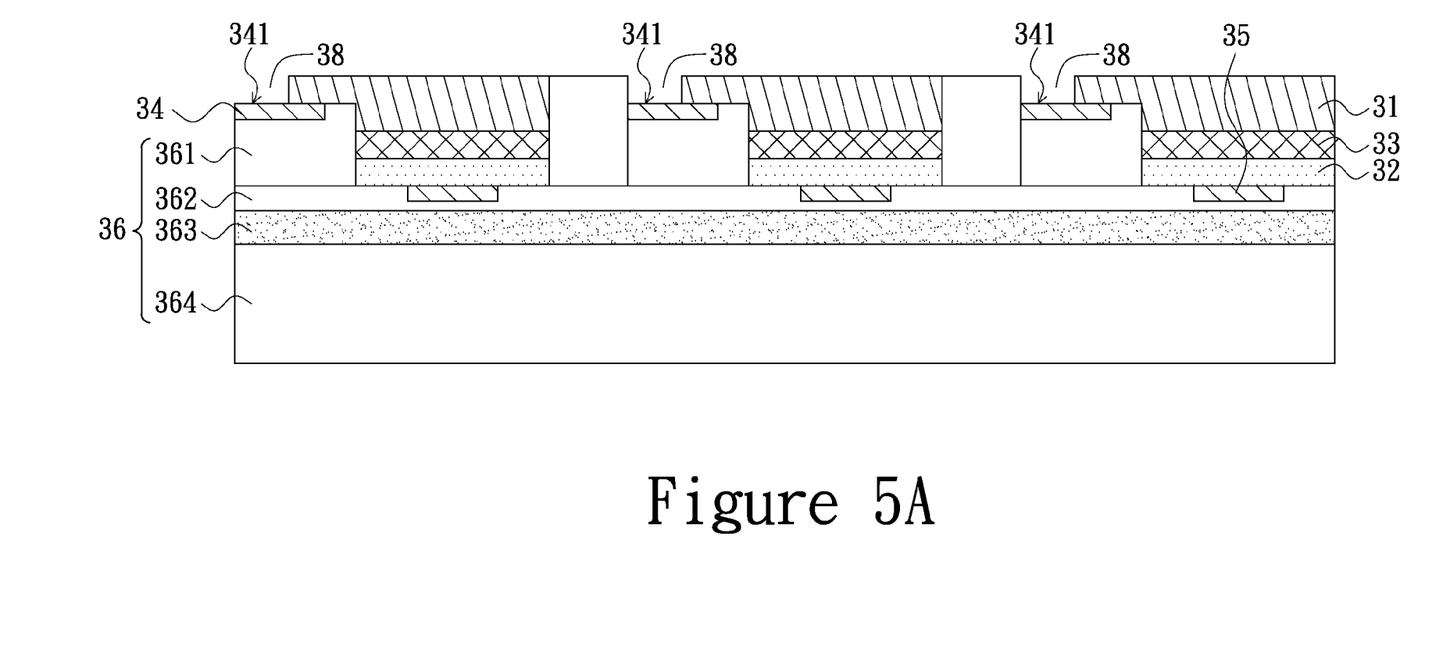
FIG. 5A and FIG. 5B illustrate schematic views of a number of light emitting diodes formed on a common permanent substrate in accordance with an embodiment of the present invention.
Figure 5B:
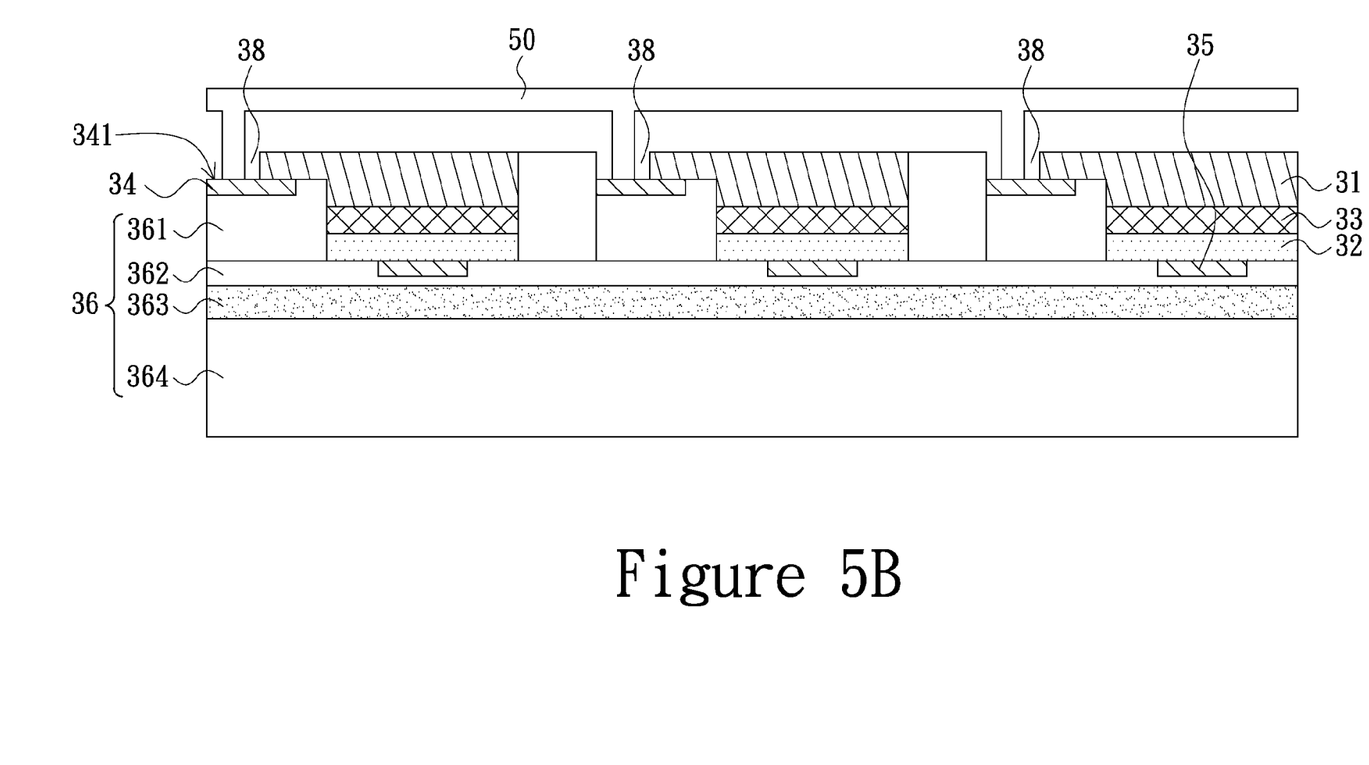

FIG. 5A and FIG. 5B illustrate schematic views of a number of light emitting diodes formed on a common permanent substrate. Referring to FIG. 5A and FIG. 5B, each of the first electrodes 34 has a portion of the surface 341 exposed. An electrode 50 is provided to connect the first electrodes 34 in parallel so that the light emitting diodes on the common permanent substrate connect in parallel. Thus, a vertical light emitting diode array with an ultra-low shade effect is provided.

Figure 6:
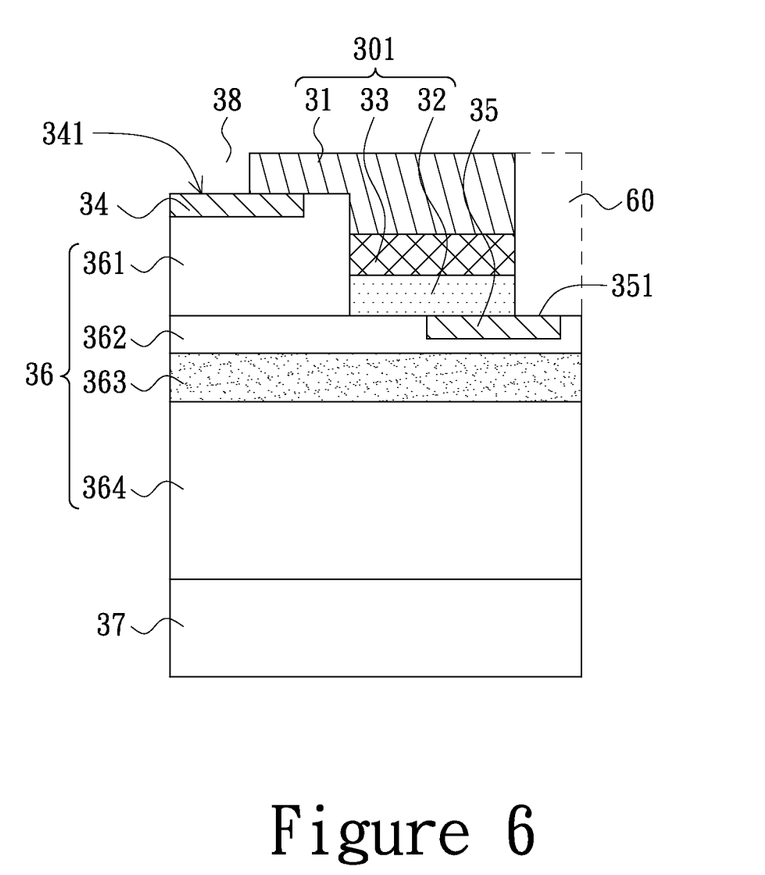
FIG. 6 illustrates a schematic view of a semiconductor light emitting diode in accordance with an embodiment of the present invention.

FIG. 6 is a schematic view of a semiconductor light emitting diode in accordance with another embodiment of the present invention. Referring to FIG. 6, a second cutout structure 60 is formed by removing a portion of the epitaxial structure 301 so as to expose at least a portion of a surface 351 of the second electrode 35. Specially, the first type doped layer 31, the light emitting portion 33 and the second type doped layer 32 are etched from the first surface 312 to form the second cutout structure 60 to expose the portion of the surface of the second electrode 35. As above-mentioned, if the reflective layer 362 is replaced by a DBR, the light emitting diode of this embodiment can be made into a horizontal light emitting diode.

In sum, the light emitting diodes in the embodiments of the present invention at least have the following advantages: (1) vertical light emitting diodes with an ultra-low shade effect can be obtained; (2) a circuit can be formed on a permanent substrate; (3) a reflective layer can function as a mirror, it can be in direct ohmic contact with the second type doped layer to work as an electrode, and it can be connected with the second type doped layer to transfer heat; (4) an insulating layer/reflective layer can form an omni-directional reflector (ODR) when a thickness of the insulating layer is equal to a light wavelength of approximately (4 n); (5) compared to the manufacturing process of flip-chip structures, circuit alignment is not needed in the method of the present invention; and (6) the permanent substrate can directly contact with the heat sink to transfer heat quickly.

While the invention has been described in terms of what is presently considered to be the most practical embodiments, it is to be understood that the invention need not be limited to the embodiment described. Rather, the above description is intended to cover various modifications and similar arrangements included within the spirit and scope of the appended claims which are to be accorded with the broadest interpretation so as to encompass all such modifications and similar structures.

What is claimed is:

1. A semiconductor light emitting component, comprising:
    an epitaxial structure comprising a first type doped layer, a light emitting portion and a second type doped layer;
    a first electrode formed on a surface of said first type doped layer;
    a second electrode formed on a surface of said second type doped layer;
    a first cutout structure formed in said first type doped layer to expose at least a portion of the first electrode; and
    a second cutout structure formed in said first type doped layer, said light emitting portion and said second type doped layer so as to expose at least a portion of said second electrode.

2. The semiconductor light emitting component of claim 1, further comprising a functional structure formed on said first electrode.

3. The semiconductor light emitting component of claim 2, wherein said functional structure comprises:
    an insulating layer formed on said first electrode;
    a reflective layer formed on said insulating layer;
    a seed layer formed on said reflective layer; and
    a permanent layer formed on said seed layer.

4. The semiconductor light emitting component of claim 2, wherein said functional structure comprises:
    an insulating layer formed on said first electrode;
    a reflective layer formed on said insulating layer; and
    a permanent layer formed on said reflective layer.

5. The semiconductor light emitting component of claim 2, wherein said functional structure comprises:
    an insulating reflective layer formed on said first electrode; and
    a permanent layer formed on said insulating reflective layer.

6. The semiconductor light emitting component of claim 1, wherein said first type doped layer is an n-type layer and said second type doped layer is a p-type layer.

7. The semiconductor light emitting component of claim 1, wherein said first type doped layer is a p-type layer and said second type doped layer is an n-type layer.

8. A semiconductor light emitting component, comprising:
    an epitaxial structure comprising a first type doped layer, a light emitting portion and a second type doped layer;
    a second electrode formed on a surface of said second type doped layer; and
    a second cutout structure formed in said first type doped layer, said light emitting portion and said second type doped layer so as to expose at least a portion of said second electrode.

9. The semiconductor light emitting component of claim 8, further comprising a first electrode formed on a surface of said first type doped layer.

10. The semiconductor light emitting component of claim 9, further comprising a functional structure formed on said first electrode.

11. The semiconductor light emitting component of claim 10, wherein said functional structure comprises:
    an insulating layer formed on said first electrode;
    a reflective layer formed on said insulating layer;
    a seed layer formed on said reflective layer; and
    a permanent layer formed on said seed layer.

12. The semiconductor light emitting component of claim 10, wherein said functional structure comprises:
    an insulating layer formed on said first electrode;
    a reflective layer formed on said insulating layer; and
    a permanent layer formed on said reflective layer.

13. The semiconductor light emitting component of claim 10, wherein said functional structure comprises:
    an insulating reflective layer formed on said first electrode; and
    a permanent layer formed on said insulating reflective layer.

14. The semiconductor light emitting component of claim 8, wherein said first type doped layer is an n-type layer and said second type doped layer is a p-type layer.

15. The semiconductor light emitting component of claim 8, wherein said first type doped layer is a p-type layer and said second type doped layer is an n-type layer.

* * * * *